United States Patent
Kaskoun et al.

(10) Patent No.: US 8,502,373 B2
(45) Date of Patent: Aug. 6, 2013

(54) 3-D INTEGRATED CIRCUIT LATERAL HEAT DISSIPATION

(75) Inventors: Kenneth Kaskoun, San Diego, CA (US); Shiqun Gu, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 369 days.

(21) Appl. No.: 12/115,076

(22) Filed: May 5, 2008

(65) Prior Publication Data

US 2009/0273068 A1    Nov. 5, 2009

(51) Int. Cl.
*H01L 23/34* (2006.01)

(52) U.S. Cl.
USPC ........... 257/712; 257/692; 257/705; 257/706; 438/122

(58) Field of Classification Search
USPC .................. 257/692, 705, 706, 712; 438/122
See application file for complete search history.

(56) References Cited

U.S. PATENT DOCUMENTS

| | | | |
|---|---|---|---|
| 4,731,701 A * | 3/1988 | Kuo et al. | 361/712 |
| 4,764,804 A * | 8/1988 | Sahara et al. | 257/717 |
| 5,050,039 A * | 9/1991 | Edfors | 361/710 |
| 5,414,299 A * | 5/1995 | Wang et al. | 257/702 |
| 5,532,512 A | 7/1996 | Fillion et al. | |
| 5,825,080 A | 10/1998 | Imaoka et al. | |
| 6,278,181 B1 * | 8/2001 | Maley | 257/712 |
| 6,282,094 B1 * | 8/2001 | Lo et al. | 361/704 |
| 6,333,557 B1 * | 12/2001 | Sullivan | 257/758 |
| 6,337,513 B1 * | 1/2002 | Clevenger et al. | 257/706 |
| 6,507,115 B1 * | 1/2003 | Hofstee et al. | 257/777 |
| 6,512,292 B1 * | 1/2003 | Armbrust et al. | 257/712 |
| 6,519,154 B1 * | 2/2003 | Chiu | 361/704 |
| 6,573,538 B2 * | 6/2003 | Motsiff et al. | 257/127 |
| 6,720,662 B1 | 4/2004 | Den | |
| 6,753,600 B1 * | 6/2004 | Ho | 257/698 |
| 7,138,711 B2 * | 11/2006 | Yee et al. | 257/720 |
| 7,205,651 B2 * | 4/2007 | Do et al. | 257/706 |
| 7,414,316 B2 | 8/2008 | Liu et al. | |
| 7,514,116 B2 * | 4/2009 | Natekar et al. | 427/96.1 |
| 7,738,249 B2 * | 6/2010 | Chan et al. | 361/679.53 |
| 2002/0089016 A1 | 7/2002 | Joly et al. | |

(Continued)

FOREIGN PATENT DOCUMENTS

| JP | 62194652 | 8/1987 |
|---|---|---|
| JP | 2001135783 A | 5/2001 |

(Continued)

OTHER PUBLICATIONS

International Search Report—PCT/US2009/041780, International Search Authority—European Patent Office—Sep. 1, 2009.

(Continued)

*Primary Examiner* — Jarrett Stark
*Assistant Examiner* — Nicholas Tobergte
(74) *Attorney, Agent, or Firm* — Michelle Gallardo

(57) ABSTRACT

By filling an air gap between tiers of a stacked IC device with a thermally conductive material, heat generated at one or more locations within one of the tiers can be laterally displaced. The lateral displacement of the heat can be along the full length of the tier and the thermal material can be electrically insulating. Through silicon-vias (TSVs) can be constructed at certain locations to assist in heat dissipation away from thermally troubled locations.

25 Claims, 3 Drawing Sheets

(56) References Cited

U.S. PATENT DOCUMENTS

| | | |
|---|---|---|
| 2005/0078456 A1 | 4/2005 | Mandel et al. |
| 2006/0025515 A1* | 2/2006 | Scaringe et al. .............. 524/496 |
| 2006/0032622 A1* | 2/2006 | Yen et al. ...................... 165/185 |
| 2006/0091552 A1 | 5/2006 | Breit et al. |
| 2006/0145356 A1 | 7/2006 | Liu et al. |
| 2007/0235847 A1* | 10/2007 | Ramanathan et al. ......... 257/678 |
| 2011/0156236 A1* | 6/2011 | Ma ................................ 257/690 |

FOREIGN PATENT DOCUMENTS

| | | |
|---|---|---|
| JP | 2007221078 A | 8/2007 |
| KR | 20000011896 A | 2/2000 |
| RU | 2299497 C2 | 5/2007 |

OTHER PUBLICATIONS

Written Opinion—PCT/US2009/041780, International Search Authority—European Patent Office Sep. 1, 2009.

Taiwan Search Report—TW098114847—TIPO—Aug. 9, 2012.

Nihei et al., Low-resistance multi-walled carbon nanotube vias with parallel channel conduction of inner shell [IC interconnect application], (conference Publication), Jun. 6-8, 2005, pp. 3. http://ieeexplore.ieee.org/xpls/abs-all.jsp?arnumber=1499995&tag=1.

* cited by examiner

3-D INTEGRATED CIRCUIT LATERAL HEAT DISSIPATION

FIELD OF DISCLOSURE

This disclosure relates to integrated circuits (ICs), and more specifically to multi-tiered (3-D) ICs, and even more specifically to systems and methods for enhancing heat dissipation in 3-D ICs.

BACKGROUND

In IC technology there is a need to stack the chips (dies) together to form multi-tiered or three-dimensional (3-D) IC devices. One result of such 3-D IC stacking is a decrease of signal propagation time during signal processing, due to the reduced distance signals must travel when they remain within a single package.

One method for tier bonding is to bring two (or more) dies together and then encapsulate the dies into a single structure. Electrical conductors and/or contacts on the surface of the respective dies serve to carry electrical signals between components on the different dies.

One problem when dies are positioned in close proximity to each other is that thermal density increases. Moreover, because of the reduced size of stacked ICs, (substrate thickness going from 700-100 microns to below 20 microns), the lateral thermal conductivity is reduced. Thus, hot spots could exist with little ability to move the heat away from the heat source.

One method for increasing lateral thermal conductivity is to increase the substrate thickness of at least one of the tiers. Another method is to increase the metal layers in the chip to be able to dissipate heat This, in turn, negatively impacts the desired aspect ratio of the package, as well as degrades the signal transmission speeds.

An additional problem exists when more than one tier is bonded. In such situations, the stacked IC device contains multiple layers of oxide between tiers. Oxide, being a poor thermal conductor, adds to the heat dissipation problem.

There are several approaches that could be taken to help with the thermal conductivity issues. One such approach could use through-silicon-vias (TSVs) to move the heat from an inner portion to a surface layer, and then remove the heat using traditional methods, such as a high thermal conductivity material positioned on a surface of the IC package. A problem with such a solution is that a circuit layout may prevent positioning a TSV at the necessary location because of devices constructed in the various tiers in proximity to the hot spot generating the heat.

Another method is to circulate cooling material through the stacked IC device to cool the various hot spots. This is costly to manufacture because the moving liquid requires a pumping mechanism and tight tolerances for liquid channels. Also, it may not be possible to channel the cooling material to the necessary location. The channeling problem could be overcome, to some extent, by forcing cooling liquid through the substrate itself, but this method is not without a further set of problems and costs.

SUMMARY OF THE DISCLOSURE

Embodiments of the invention fill an air gap between stacked dies with a thermally conductive material, which allows heat generated at one or more locations within each die to be laterally displaced. The lateral displacement of the heat can be along the full length of the die or along a portion of the length. In one embodiment, the thermal material is electrically insulating. In one embodiment, TSVs, perhaps using carbon nanotubes can be constructed at certain locations to assist in heat dissipation away from thermally troubled locations.

In one embodiment, a multi-tiered semi-conductor has a thermally conductive material disposed between first and second tiers wherein the material has a higher thermal conductivity than the thermal conductivity of said first and second tiers.

In another embodiment, a method of manufacturing a tiered semi-conductor is disclosed in which a thermally conductive material is applied to at least one mating surface of a first die and the mating surface of that die is brought into mated contact with a mating surface of a second die.

In still another embodiment, a method for heat dissipation in a stacked IC device is disclosed which allows heat from a thermally troubled area of one layer of a multi-tiered IC device to flow to an inter-layer between adjacent tiers of the device, such that lateral heat flow is facilitated in the inter-layer area to at least one heat dissipation location in thermal communication with the inter-layer area. In one embodiment, the heat dissipation area is a via constructed through at least one layer of a tier of the device. In another embodiment, the heat dissipation area is a gap between adjacent dies in a same tier.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DESCRIPTION OF THE EMBODIMENTS OF THE INVENTION

Figure 1:
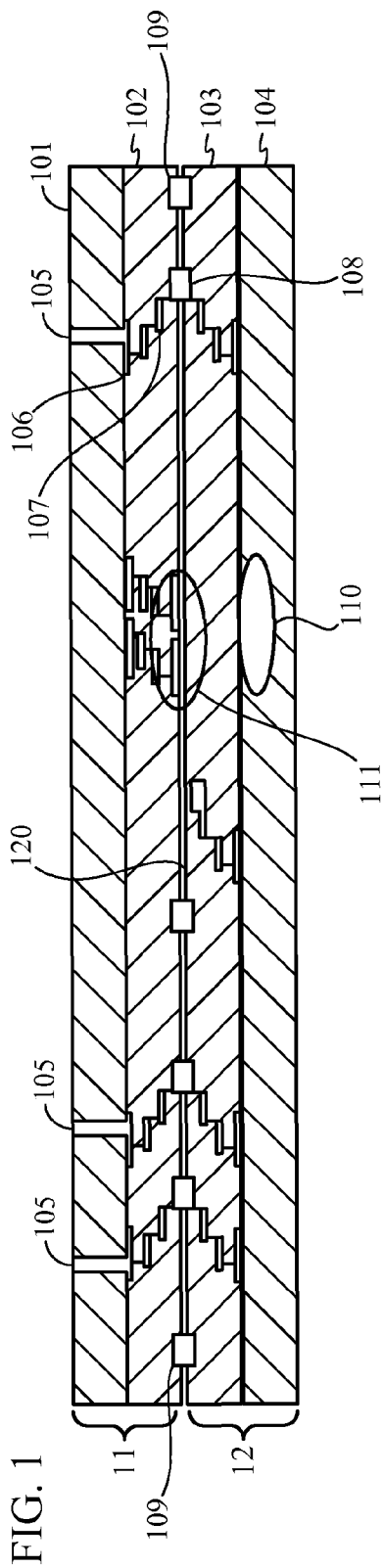
FIG. 1 is a cross sectional side view illustrating one aspect of thermal trouble conditions that could exist with 3-D integrated circuits.

FIG. 1 illustrates one aspect of thermal trouble conditions that could exist with 3-D integrated circuits. As shown in FIG.

1, a die 11 is stacked with a die 12. The active layer of die 11 is a layer 102 and the active layer of die 12 is a layer 103. This is an exemplary arrangement as the active layers of the dies could be in any orientation, up or down.

Vias 105 run through the substrate layer 101 of the die 11. Vias could be constructed in the layers 102, 103 and/or 104 as desired. Electrical paths 107 and 108 form an interconnect between the dies. Seal 109 acts to prevent non-desired contaminants from entering the area 120 between the respective dies 11, 12.

Element 108 is normally on the scale of 30 microns or less and normally forms a copper or a tin copper metal to metal bond. Area 120 is usually an air gap. The gap 120 can be in the range of less than 10 micron.

A hot spot 110 is on the die 12 and the challenge is to move heat from this relatively small area 110 to an external portion of the die stack. Note that elements 111 are directly above the hot spot 110 and would be affected by heat from the hot spot 110 moving upward through the layers 103, 102, 101.

Figure 2:
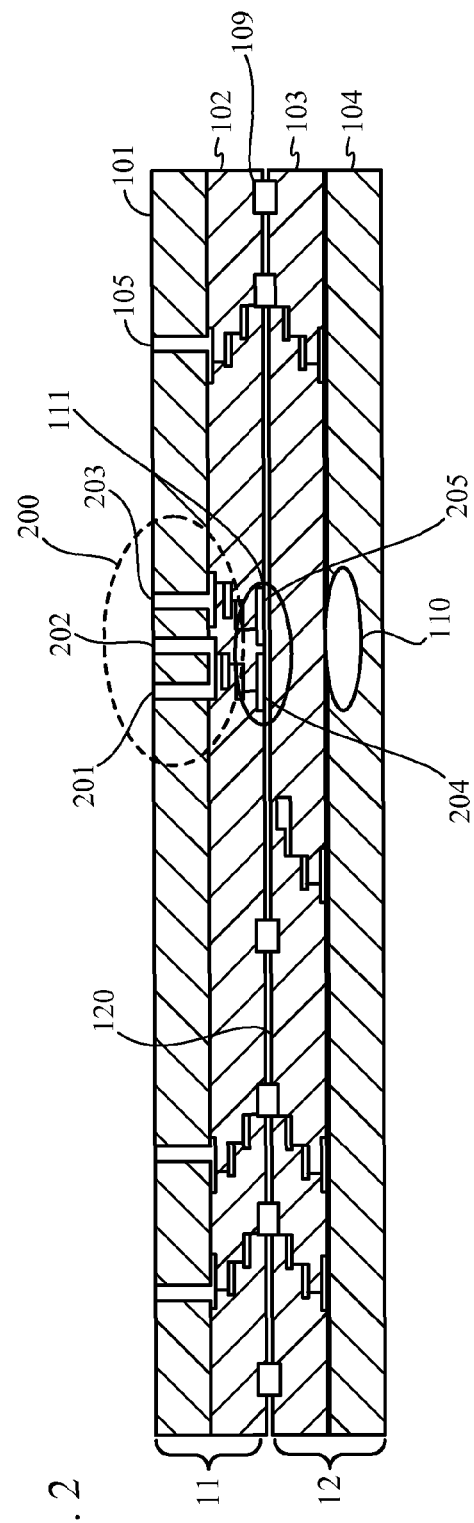
FIG. 2 is a cross sectional side view illustrating one exemplary solution to the heat removal problem.

FIG. 2 illustrates one discussed solution to the heat removal problem. In this solution, a TSV array 200 having individual TSVs 201, 202, and 203 is positioned to provide thermal conductivity for heat from the hot spot 110. The heat passes through the layer 103, which is the active area of bottom die 12. The heat then passes through the active layer 102 of the die 11 and is then pulled out to the exterior via the TSV array 200. The vias 201, 202, 203 may be copper or tungsten lined to increase thermal conductivity, but any thermally conductive material would work. In one embodiment, carbon nanotubes (CNTs) can be used to fill the vias 201, 202, 203. In another embodiment, CNTs partially fill the vias 201, 202, 203 and metal fills the remainder of the vias 201, 202, 203. An advantage of the CNTs is improved electrical and thermal conductivity, as well as improved current density.

Figure 3:
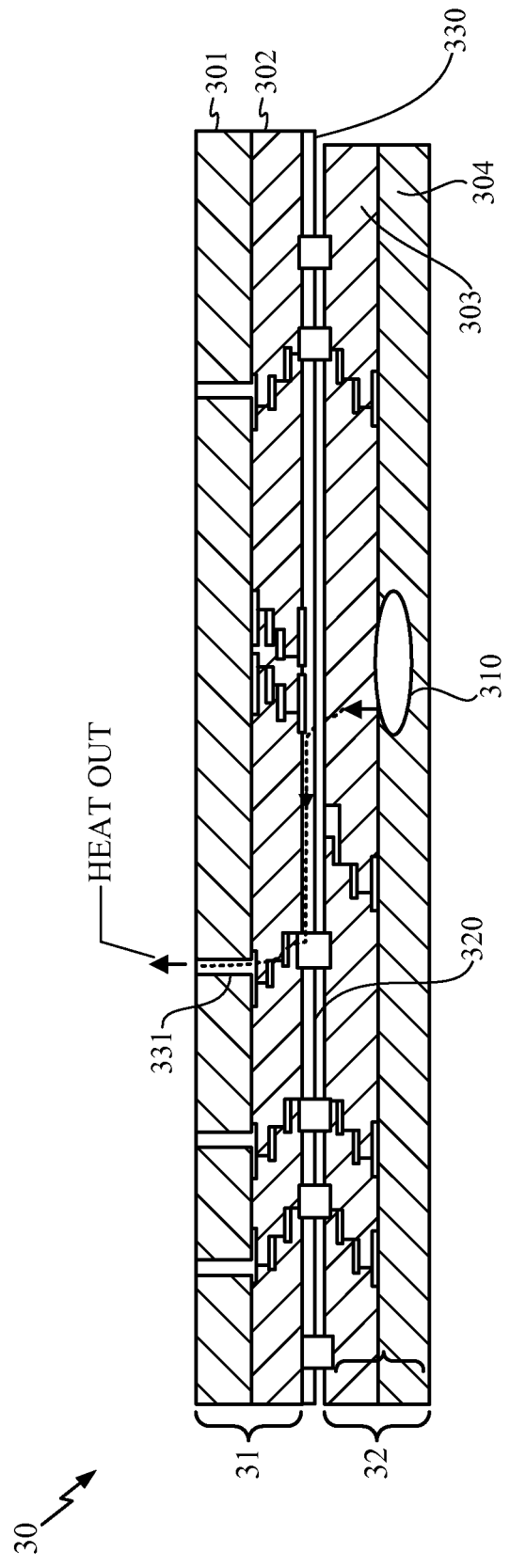
FIG. 3 is a cross sectional side view showing one embodiment of the concepts of the disclosure.

FIG. 3 shows one embodiment 30 in which the concepts of the disclosure are utilized. Thermally conductive material 320 is positioned within a gap between the dies 31 and 32. In another embodiment, the thermally conductive material 320 is between metal layers (not shown) of one of the active layers 302, 303 of the tiers 31, 32. The thermally conductive material 320 ideally would have thermal conductivity greater than 10 W/m/K so as to facilitate lateral heat transfer. The material 320 is thermally conductive, and in one embodiment electrically insulating so that it does not short circuit the electrical connections that connect the dies 31, 32, which would interfere with the operation of elements contained in the dies 31, 32. The material 320 can be positioned by a variety of methods, for example, spun on or deposited by chemical vapor deposition (CVD), and/or physical vapor deposition (PVD). The material 320 may be a diamond matrix or a diamond film pattern.

Although only shown on one layer 302 of one of the dies 31, the material 320 can be positioned on a surface of each of the two mating layers 302, 303, so that the material 320 on each layer 302, 303 actually touches each other when the dies 31, 32 are stacked. Alternatively, the material 320 may be placed only on one of the mating layers 302, 303.

In operation, heat from hot spot 310 passes upward through the layer 303 of the die 32 and into the material 320. The heat then travels laterally along the material 320 either to an edge of the device, such as over hanging edge 330 or more typically, the heat will pass up through one or more heat dissipating vias, such as through the via 331 constructed in the layer 301 of the die 31. Because of the lateral movement of the heat, there is a better uniformity of the temperature across the device 30. This benefit allows heat to spread relatively quickly across the whole device 30, thereby causing the device 30 to evenly heat up. The removal of heat from a larger area, such as the entire device 30 or the package of the device is easier to accomplish than removing heat from a small, internal area.

Note that the heat dissipating via 331 can pass up through die 31, or down through die 32 (or both). One advantage of the thermally conductive material 320 is that the heat dissipating via 331 can be laterally offset from the thermally troubled area 310 thereby freeing areas directly above the troubled area to be used for circuitry or other elements constructed in the various layers 301, 302, 303. Also note that the heat need not flow directly upward through the layers 301, 302, 303 but rather the via 331 could, for example, be angled and/or curved. Another advantage of the lateral heat dissipation is that fewer TSVs are needed.

For multi-tiered devices having more than two tiers, multiple inter-layer heat dissipating material structures can be used. Thus, the heat can move laterally from the heat source a first distance within a first inter-layer area and then pass up one tier with the assistance of a via and then again move laterally (in any direction) in a second inter-layer area, provided thermally conductive material is positioned in both first and second inter-layer areas.

One system for allowing even greater heat removal from the material 320 is to make one of the layers, such as the dies 31 circumferentially larger than the other die 32 thereby creating a surface area, such as surface area 330.

In one embodiment, a bottom die is larger than a top die. Thus, a gap would exist between two top dies (of a single tier) that rest on the bottom die. According to the present disclosure, gap fill material can be provided within this gap between the top dies. The gap fill material can be thermally conductive and can be any material with good thermal conductivity, such as a diamond film. In one embodiment, the thermally conductive gap fill material is thermally coupled to the material 320 to help transfer heat out of the stacked IC device.

Figure 4:
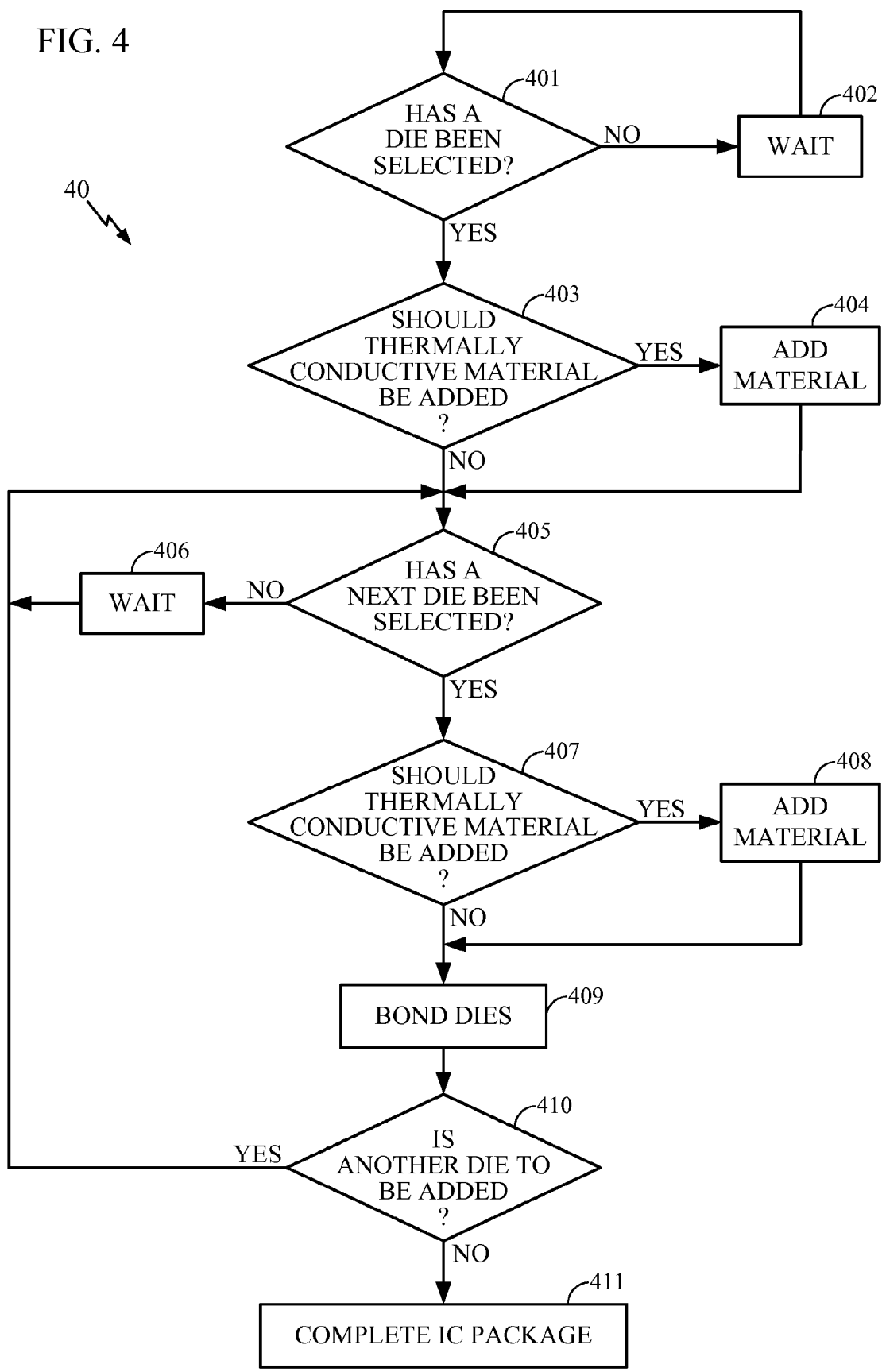
FIG. 4 shows one embodiment of method for constructing stacked IC device in accordance with the teaching of the disclosure.

FIG. 4 shows one embodiment 40 of a method for constructing stacked IC devices in accordance with the teachings of the disclosure. Process 401 determines if a die has been selected for constructing a stacked IC device. If not, then process 402 controls a wait time. After a die has been selected, process 403 determines if a thermally conductive material should be added to at least one lateral surface of the die. The thermally conductive material can be deposited under control of process 404 by any one of the methods discussed above, such as CVD or PVD processing, or the material can be spun on, or applied as a film.

Processes 405 and 406 wait for a next die to be selected for mating with the previously selected die. Process 407 and 408 add thermally conductive material to this next die, if appropriate, and process 409 then bonds the dies together. Process 410 determines if more dies are to be added. When all the dies have been selected and coated with thermally conductive material (if appropriate), process 411 completes the IC package which is then available for testing and/or usage.

Although the present invention and its advantages have been described in detail, it should be understood that various changes, substitutions and alterations can be made herein without departing from the spirit and scope of the invention as defined by the appended claims. For example, although the material 320 has been described as being non-electrically conductive, it is possible to make the material electrically conductive. In this embodiment, the electrically conductive material should be patternable, i.e., capable of being patterned, such that it can be separated from some vias to prevent electrical connections while still thermally dissipating heat.

The scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. A three dimensional integrated circuit (IC) device, comprising:
    a first die stacked on a second die, each die comprising an active face and a substrate, the dies' active faces coupled together by a plurality of tier to tier connections, and the tier to tier connections creating a gap between the active laces of the first and second die;
    a through-substrate via filled with a first thermally conductive material disposed in the first die; and
    a thermally conductive layer positioned within the gap.

2. The three dimensional integrated circuit (IC) device of claim 1 wherein a thermal conductivity of the first thermally conductive material is at least 10 W/m/K.

3. The three dimensional integrated circuit (IC) device of claim 1 wherein the first thermally conductive material is electrically insulating.

4. The three dimensional integrated circuit (IC) device of claim 1 wherein the first thermally conductive material is a patterned film.

5. The three dimensional integrated circuit (IC) device of claim 1 further comprising:
    a second thermally conductive material disposed at an end of at least one of the die, the second thermally conductive material being thermally coupled to the first thermally conductive material disposed in the first die.

6. The three dimensional integrated circuit (IC) device of claim 1 wherein the thermally conductive layer is selected from a list of diamond matrix and diamond film pattern.

7. The three dimensional integrated circuit (IC) device of claim 1 in which the first thermally conductive material is comprised at least partially of carbon nanotubes.

8. The three dimensional integrated circuit (IC) device of claim 1 in which the first die is circumferentially larger than the second die.

9. The three dimensional integrated circuit (IC) device of claim 8 in which the second die comprises at least two dies, at least one of the two dies further comprising a second thermally conductive layer.

10. The three dimensional integrated circuit (IC) device of claim 1 wherein the thermally conductive layer is deposited by one of CVD, PVD, spin on, and screen on.

11. A three dimensional integrated circuit (IC) device, comprising:
    a first die and a second die, each die comprising an active face and a substrate;
    means for coupling the dies' active faces, the means for coupling creating a gap between the first die and second die;
    means, disposed in a via extending through the first die, for conducting heat; and
    means disposed within the gap, for conducting heat.

12. The three dimensional integrated circuit (IC) device of claim 11 wherein
    the means disposed within the gap is selected from a list of diamond matrix and diamond film pattern.

13. The three dimensional integrated circuit (IC) device of claim 11 wherein the means disposed in a via extending through the first die consists of carbon nanotubes.

14. A three dimensional integrated circuit (IC) device, comprising:
    a first die stacked on a second die, the first die being circumferentially larger than the second die;
    the first and second dies coupled together by a plurality of tier to tier connections, and the tier to tier connections creating a gap between the first and second die;
    a through-substrate via filled with a thermally conductive material disposed in the first die; and
    the second die comprising a thermally conductive layer.

15. The three dimensional integrated circuit (IC) device of claim 14 in which the second die comprises at least two dies, at least one of the two dies further comprising a second thermally conductive layer.

16. An integrated circuit (IC) device, comprising:
    a first die comprising an active layer on a substrate,
    a through-substrate via filled with a thermally conductive material disposed in the first die; and
    a thermally conductive and electrically insulating layer directly coupled to only the active layer of the first die distal from the substrate.

17. The integrated circuit (IC) device of claim 16 wherein a thermal conductivity of the thermally conductive material is at least 10 W/m/K.

18. The integrated circuit (IC) device of claim 16 wherein the thermally conductive material is electrically insulating.

19. The integrated circuit (IC) device of claim 16 wherein the thermally conductive material is a patterned film.

20. The integrated circuit (IC) device of claim 16 further comprising:
    a second die having an active layer on a substrate;
    the first and the second die coupled together by a plurality of tier to tier connections, the tier to tier connections creating a gap between the first and second die; and
    the thermally conductive and electrically insulating layer provided within the gap.

21. The integrated circuit (IC) device of claim 16 wherein the thermally conductive and electrically insulating layer is selected from a list of diamond matrix and diamond film pattern.

22. The circuit (IC) device of claim 20 in which the first die is circumferentially larger than the second die.

23. The integrated circuit (IC) device of claim 16 wherein the thermally conductive and electrically insulating layer is deposited, by one of CVD, PVD, spin on, and screen on.

24. The integrated circuit (IC) device of claim 16 wherein the thermally conductive material is electrically conductive.

25. The circuit (IC) device of claim 24 in which the thermally conductive material is comprised at least partially of carbon nanotubes.

* * * * *